United States Patent
Kato et al.

(10) Patent No.: US 10,250,214 B2
(45) Date of Patent: Apr. 2, 2019

(54) FILTER DEVICE, MULTIPLEXER, RADIO-FREQUENCY FRONT END CIRCUIT, AND COMMUNICATION DEVICE

(71) Applicant: Murata Manufacturing Co., Ltd., Nagaokakyo-shi, Kyoto-fu (JP)

(72) Inventors: Masanori Kato, Nagaokakyo (JP); Syunsuke Kido, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/794,072

(22) Filed: Oct. 26, 2017

(65) Prior Publication Data
US 2018/0123547 A1    May 3, 2018

(30) Foreign Application Priority Data

Oct. 31, 2016 (JP) ................... 2016-213788
Aug. 30, 2017 (JP) ................... 2017-165902

(51) Int. Cl.
| | | |
|---|---|---|
| H03H 7/01 | (2006.01) | |
| H03H 7/38 | (2006.01) | |
| H03H 9/46 | (2006.01) | |
| H04J 1/04 | (2006.01) | |
| H03H 9/54 | (2006.01) | |

(Continued)

(52) U.S. Cl.
CPC ............ *H03H 7/0161* (2013.01); *H03H 7/01* (2013.01); *H03H 7/38* (2013.01); *H03H 9/465* (2013.01); *H03H 9/542* (2013.01); *H03H 9/605* (2013.01); *H03H 9/6483* (2013.01); *H04J 1/045* (2013.01); *H03H 2007/013* (2013.01); *H03H 2009/02299* (2013.01)

(58) Field of Classification Search
CPC .... H03H 7/0161; H03H 9/6483; H03H 9/605; H03H 9/542; H03H 7/01; H03H 9/465; H03H 7/38; H04J 1/045
See application file for complete search history.

(56) References Cited

U.S. PATENT DOCUMENTS

| | | | | |
|---|---|---|---|---|
| 6,396,365 | B1* | 5/2002 | Miller | H03H 7/463 333/129 |
| 2016/0352374 | A1* | 12/2016 | Wloczysiak | H04B 1/10 |
| 2017/0214390 | A1* | 7/2017 | Tsukamoto | H03H 9/542 |

FOREIGN PATENT DOCUMENTS

| | | |
|---|---|---|
| EP | 2 416 496 A1 | 2/2012 |
| JP | 5088416 B2 | 12/2012 |

* cited by examiner

*Primary Examiner* — Thai Nguyen
(74) *Attorney, Agent, or Firm* — Keating & Bennett, LLP

(57) ABSTRACT

A filter includes two series arm resonators electrically connected in series between two input/output terminals, a parallel arm resonator electrically connected between a ground and a series arm between the two series arm resonators, an inductor electrically connected in parallel to the two series arm resonators, and a matching circuit electrically connected between one of the two series arm resonators and one of the input/output terminals, wherein the two series arm resonators and the parallel arm resonator define a pass band of a bandpass filter, the two series arm resonators and the inductor define an LC resonant circuit, respective anti-resonant frequencies of each of the two series arm resonators and a resonant frequency of the parallel arm resonator are located in a pass band of the LC resonant circuit, and a resonant frequency of the LC resonant circuit is lower than the resonant frequency of the parallel arm resonator.

21 Claims, 11 Drawing Sheets

(51) Int. Cl.
*H03H 9/60* (2006.01)
*H03H 9/64* (2006.01)
*H03H 9/02* (2006.01)

FILTER DEVICE, MULTIPLEXER, RADIO-FREQUENCY FRONT END CIRCUIT, AND COMMUNICATION DEVICE

CROSS REFERENCE TO RELATED APPLICATIONS

This application claims the benefit of priority to Japanese Patent Application No. 2016-213788 filed on Oct. 31, 2016 and Japanese Patent Application No. 2017-165902 filed on Aug. 30, 2017. The entire contents of these applications are hereby incorporated herein by reference.

BACKGROUND OF THE INVENTION

1. Field of the Invention

The present invention relates to a filter device including resonators, and to a multiplexer, a radio-frequency front end circuit, and a communication device.

2. Description of the Related Art

A ladder filter using acoustic wave resonators has been proposed. For example, a filter device including two series arm resonators, three parallel arm resonators, and an inductor arranged in a state bridging the two series arm resonators is disclosed (see, e.g., Japanese Patent No. 5088416). In the disclosed filter device, a low pass filter (LC resonant circuit) is defined by the inductor and the two series arm resonators. Furthermore, resonant frequencies of the two series arm resonators or the three parallel arm resonators are located in an attenuation band of the low pass filter. Thus, attenuation characteristics are able to be improved by setting sharp attenuation poles, which are obtained by the resonators, to be overlapped with the attenuation band of the low pass filter.

However, the above-described configuration of the related art has a problem that a loss of a pass band increases because the attenuation pole of the low pass filter (LC resonance circuit) is overlapped with the sharp attenuation poles obtained by the resonators.

SUMMARY OF THE INVENTION

Preferred embodiments of the present invention provide filter devices, multiplexers, radio-frequency front end circuits, and communication devices in which filter characteristics with a smaller loss are achieved.

According to a preferred embodiment of the present invention, a filter device includes a first series arm resonator and a second series arm resonator electrically connected in series between a first terminal and a second terminal, the first series arm resonator being located on a side closer to the first terminal, the second series arm resonator being located on a side closer to the second terminal, a parallel arm resonator electrically connected between a ground and a series arm between the first series arm resonator and the second series arm resonator, a first inductor electrically connected in parallel to the first series arm resonator and the second series arm resonator, and a matching circuit electrically connected between the second series arm resonator and the second terminal or between the first series arm resonator and the first terminal, wherein the first series arm resonator, the second series arm resonator, and the parallel arm resonator define a pass band of a bandpass filter, the first series arm resonator, the second series arm resonator, and the first inductor define an LC resonant circuit, respective anti-resonant frequencies of each of the first series arm resonator and the second series arm resonator and a resonant frequency of the parallel arm resonator are located in a pass band of the LC resonant circuit, and a resonant frequency of the LC resonant circuit is lower than the resonant frequency of the parallel arm resonator.

According to the filter device described above, the two series arm resonators and the first inductor define an LC resonant circuit with a wide pass band. Furthermore, the respective anti-resonant frequencies of each of the first series arm resonator and the second series arm resonator and the resonant frequency of the parallel arm resonator are located in the pass band of the LC resonant circuit. The first series arm resonator, the second series arm resonator, and the parallel arm resonator operate as notch filters in order to locally attenuate the pass band of the LC resonant circuit. Since the respective anti-resonant frequencies of each of the two series arm resonators are higher than the resonant frequency of the parallel arm resonator, the parallel arm resonator provides an attenuation slope on a lower frequency side of the pass band of the filter device, and the two series arm resonators provide an attenuation slope on a higher frequency side of the pass band of the filter device. Accordingly, the pass band of the filter device is able to be widened by setting the respective anti-resonant frequencies of each of the two series arm resonators and the resonant frequency of the parallel arm resonator to be located farther away from each other. Moreover, a loss in the pass band of the filter device is able to be significantly reduced by adjusting the matching circuit. As a result, bandpass-type filter characteristics of a wide pass band and a smaller loss are able to be provided.

The resonant frequency of the parallel arm resonator may be lower than the respective anti-resonant frequencies of each of the first series arm resonator and the second series arm resonator, for example.

The matching circuit may be a second inductor electrically connected between the ground and a junction between the first terminal and the second terminal, for example.

Thus, a matching circuit is able to define and function as a filter that attenuates a low band (about 699 MHz to about 960 MHz), for example.

The matching circuit may be a third inductor electrically connected in series between the first terminal and the second terminal, for example.

Thus, a matching circuit is able to define and function as a filter that attenuates a frequency band of about 5 GHz, for example.

Each of the parallel arm resonator, the first series arm resonator, and the second series arm resonator may include a substrate including a piezoelectric layer, and an IDT electrode provided on the substrate, and a piezoelectric material of the piezoelectric layer included in the parallel arm resonator is different from a piezoelectric material of each of the piezoelectric layers included in the first series arm resonator and the second series arm resonator, for example.

When the above piezoelectric materials are the same or similar, for example, an unwanted wave (bulk wave) may be generated due to the materials and a loss in the passband may be increased. However, the loss is able to be significantly reduced because the piezoelectric materials are different.

Each of the parallel arm resonator, the first series arm resonator, and the second series arm resonator may include a substrate including a piezoelectric layer, and an IDT electrode provided on the substrate, and a cut angle of the piezoelectric layer included in the parallel arm resonator may be different from a cut angle of each of the piezoelectric layers included in the first series arm resonator and the second series arm resonator, for example.

When the above cut angles are the same or similar, for example, an unwanted wave (bulk wave) may be generated due to the cut angles and a loss in the passband may be increased. However, the loss is able to be significantly reduced because the cut angles are different.

At least one of the parallel arm resonator, the first series arm resonator, and the second series arm resonator may be defined by a BAW (Bulk Acoustic Wave) resonator or an FBAR (Film Bulk Acoustic Resonator), for example.

According to a preferred embodiment of the present invention, a multiplexer includes a plurality of filters that include, as at least one among the plurality of filters, the filter device described above, wherein input terminals or output terminals of the plurality of filters are directly or indirectly electrically connected to a common terminal.

With the above features, a multiplexer with filter characteristics with a smaller loss is able to be provided.

The plurality of filters may be two filters, for example.

Thus, a diplexer with filter characteristics with a smaller loss is able to be provided.

The plurality of filters may be three filters, for example.

Thus, a triplexer with filter characteristics with a smaller loss is able to be provided.

The plurality of filters may be four filters, for example.

Thus, a quadplexer with filter characteristics with a smaller loss is able to be provided.

The plurality of filters may include a filter other than the filter device, the other filter being electrically connected to the first terminal and including different frequencies of the pass band of the bandpass filter, and the resonant frequency of the LC resonant circuit may be located in the pass band of the other filter, for example.

With the above features, a degradation of bandpass characteristics of the other filter is able to be significantly reduced or prevented.

The resonant frequency of the LC resonant circuit may be located on the lower frequency side than a center frequency of the pass band of the other filter, for example.

Thus, since the resonant frequency of the LC resonant circuit is located on the lower frequency side than the center frequency of the pass band of the other filter, an attenuation pole provided by the LC resonant circuit is located farther away from the pass band of the filter device. Accordingly, the pass band of the filter device receives a less influence from the attenuation pole provided by the LC resonant circuit, and an increase of loss on the lower frequency side of the pass band of the filter device is able to be significantly reduced or prevented.

The pass band of the filter device may be assigned to a high band of about 2300 MHz to about 2690 MHz, and the pass band of the other filter may be assigned to a middle band of about 1710 MHz to about 2200 MHz, for example.

With the above features, filter characteristics with a smaller loss are able to be provided over the high band of about 2300 MHz to about 2690 MHz. Furthermore, a loss in the middle band of about 1710 MHz to about 2200 MHz corresponding to the other filter is able to be significantly reduced.

The plurality of filters may include a low-band filter, for example. More specifically, a pass band of the low-band filter may be assigned to a low band of about 699 MHz to about 960 MHz, for example. Even more specifically, the low-band filter may be an LC filter, for example.

With the above features, a loss in the low band of about 699 MHz to about 960 MHz corresponding to the low-band filter is able to be significantly reduced.

The multiplexer may transmit and receive signals in a plurality of frequency bands corresponding to the plurality of filters at the same or substantially the same time, for example.

Thus, the multiplexer is able to be provided for carrier aggregation (CA).

According to a preferred embodiment of the present invention, a high frequency front-end circuit includes the above-described multiplexer, and a switch electrically connected to the multiplexer.

Thus, a high frequency front-end circuit including the switch and providing filter characteristics with a smaller loss is able to be provided.

According to a preferred embodiment of the present invention, a high frequency front-end circuit includes the above-described multiplexer, and an amplifier circuit electrically connected to the multiplexer.

Thus, a high frequency front-end circuit including the amplifier circuit and providing filter characteristics with a smaller loss is able to be provided.

According to a preferred embodiment of the present invention, a communication device includes an RF signal processing circuit that processes high frequency signals transmitted from and received by an antenna element, and the above-described high frequency front-end circuit that transfers the high frequency signals between the antenna element and the RF signal processing circuit.

Thus, a communication device with filter characteristics with a smaller loss is able to be provided.

With the filter devices, the multiplexers, the radio-frequency front end circuits, and the communication devices according to the preferred embodiments of the present invention, filter characteristics with a smaller loss are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
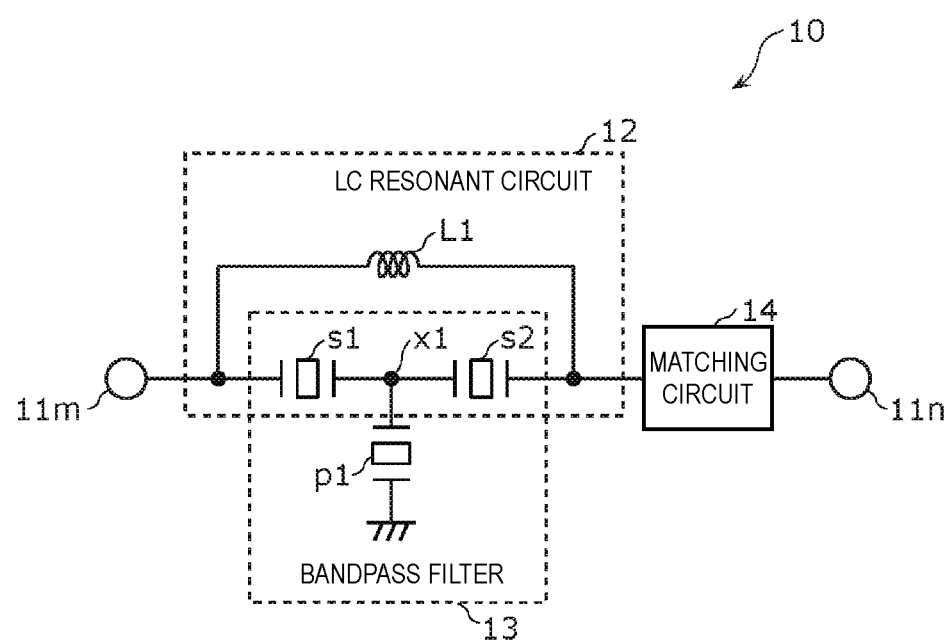
FIG. 1 is a circuit diagram of a filter according to a first preferred embodiment of the present invention.

Preferred embodiments of the present invention will be described in detail below with reference to Examples and drawings. It is to be noted that any of the following preferred embodiments represents a general or specific example. Thus, numerical values, shapes, materials, elements, arrangements and electrical connections of the elements, etc., which are described in the following preferred embodiments, are merely illustrative. In the drawings, substantially the same or similar elements are denoted by the same reference sings, and duplicate description of those elements is omitted or simplified in some cases.

First Preferred Embodiment

FIG. 1 is a circuit diagram of a filter 10 according to a first preferred embodiment of the present invention.

The filter 10 is a filter device that is arranged, for example, in a front end portion of a multi-mode/multi-band cellular phone. The filter 10 is, for example, a bandpass filter that is included in a multi-band cellular phone with respect to communication standards, such as LTE (Long Term Evolution), to filter to pass a radio frequency signal in a predetermined band therethrough.

As shown in FIG. 1, the filter 10 includes a series arm resonator s1 (a first series arm resonator), a series arm resonator s2 (a second series arm resonator), a parallel arm resonator p1, an inductor L1, and a matching circuit 14.

The series arm resonators s1 and s2 are electrically connected in series between an input/output terminal 11m (a first terminal) and an input/output terminal 11n (a second terminal). In other words, the series arm resonators s1 and s2 are resonators that are electrically connected in series between the input/output terminal 11m and the input/output terminal 11n. As an example, the input/output terminal 11m is an input terminal to which a radio frequency signal is input, and the input/output terminal 11n is an output terminal from which a radio frequency signal is output. The series arm resonator s1 is located on a side closer to the input/output terminal 11m, and the series arm resonator s2 is located on a side closer to the input/output terminal 11n.

The parallel arm resonator p1 is electrically connected between a ground (a reference terminal) and a series arm at a node x1 shown in FIG. 1 that is located between the series arm resonator s1 and the series arm resonator s2. In other words, the parallel arm resonator p1 is a resonator that is located in a parallel arm electrically connecting the node x1 on the above-mentioned series arm and the ground.

In the following description, for the sake of convenience in explanation, a singular point where an impedance of a resonator becomes locally minimal (preferably, a point where the impedance becomes zero or substantially zero) is referred to as a "resonant point", and a frequency at that singular point is referred to as a "resonant frequency". Furthermore, a singular point where a resonator impedance becomes locally maximal (preferably, a point where the impedance becomes infinite or substantially infinite) is referred to as an "anti-resonant point", and a frequency at that singular point is referred to as an "anti-resonant frequency".

The series arm resonators s1 and s2 and the parallel arm resonator p1 are each an acoustic wave resonator with the resonant point or the anti-resonant point, for example, a SAW (Surface Acoustic Wave) resonator, a BAW (Bulk Acoustic Wave) resonator, or an FBAR (Film Bulk Acoustic Resonator). Preferably, the series arm resonators s1 and s2 and the parallel arm resonator p1 are each a surface acoustic wave resonator. In that case, the filter 10 is able to be implemented by an IDT (Inter-Digital Transducer) electrode that is provided on or in a substrate that is piezoelectric. Therefore a small-sized and a low-height filter circuit with relatively sharp bandpass characteristics is able to be provided. The substrate that is piezoelectric is a substrate in which at least a surface thereof is piezoelectric. Such a substrate may include, for example, a multilayer body including a piezoelectric thin film provided on or in a surface of the substrate, a film with an acoustic velocity different from that of the piezoelectric thin film, a support base, etc. In another example, the above-mentioned substrate may include one of following multilayer bodies: a multilayer body including a support base with a high acoustic velocity and a piezoelectric thin film provided on or in the support base with the high acoustic velocity; a multilayer body including a support base with a high acoustic velocity, a film with a low acoustic velocity and provided on the support base with the high acoustic velocity, and a piezoelectric thin film provided on the film with the low acoustic velocity; and a multilayer body including a support base, a film with a high acoustic velocity and provided on the support base, a film with a low acoustic velocity and provided on the film with the high acoustic velocity, and a piezoelectric thin film provided on the film with the low acoustic velocity. The substrate may be piezoelectric in its entirety, for example.

It is to be noted that at least one of the series arm resonators s1 and s2 and the parallel arm resonator p1 may include a BAW resonator or an FBAR, for example.

The inductor L1 is a first inductor that is electrically connected in parallel to the series arm resonators s1 and s2. More specifically, the inductor L1 is electrically connected between a junction between the series arm resonator s1 and the input/output terminal 11m and a junction between the series arm resonator s2 and the matching circuit 14 described below.

The matching circuit 14 is electrically connected between the series arm resonator s2 and the input/output terminal 11n. Alternatively, the matching circuit 14 may be electrically connected between the series arm resonator s1 and the input/output terminal 11m, for example.

The series arm resonators s1 and s2 and the inductor L1 define an LC resonant circuit 12. More specifically, the LC resonant circuit 12 is defined by respective capacitance components of the two series arm resonators s1 and s2 and by the inductor L1.

Furthermore, the series arm resonators s1 and s2 and the parallel arm resonator p1 define a pass band of a bandpass filter 13.

With respect to not only the resonator itself, but also the LC resonant circuit 12, for the sake of convenience in explanation, a singular point where a combined impedance of the resonator and the inductor becomes locally minimal (preferably, a point where the combined impedance becomes zero or substantially zero) is referred to as a "resonant point", and a frequency at that singular point is referred to as a "resonant frequency" in the following description.

The series arm resonators s1 and s2 and the parallel arm resonator p1 are separate chips. In other words, the series arm resonators s1 and s2 are included in one chip, and the parallel arm resonator p1 is included in another, separate chip. When there is a large difference between the resonant frequency of each of the series arm resonators s1 and s2 and the resonant frequency of the parallel arm resonator p1, variations in characteristics are able to be significantly reduced or prevented by providing the series arm resonators s1 and s2 as a separate chip from the parallel arm resonator p1. Alternatively, the series arm resonators s1 and s2 and the parallel arm resonator p1 may be all provided in one chip, for example.

A structure of each of the resonators included in the filter 10 is described in detail below with respect to one of the resonators. The other resonators also include substantially similar structures to that of the resonator described below, and therefore detailed description of those structures is omitted.

Figure 2:
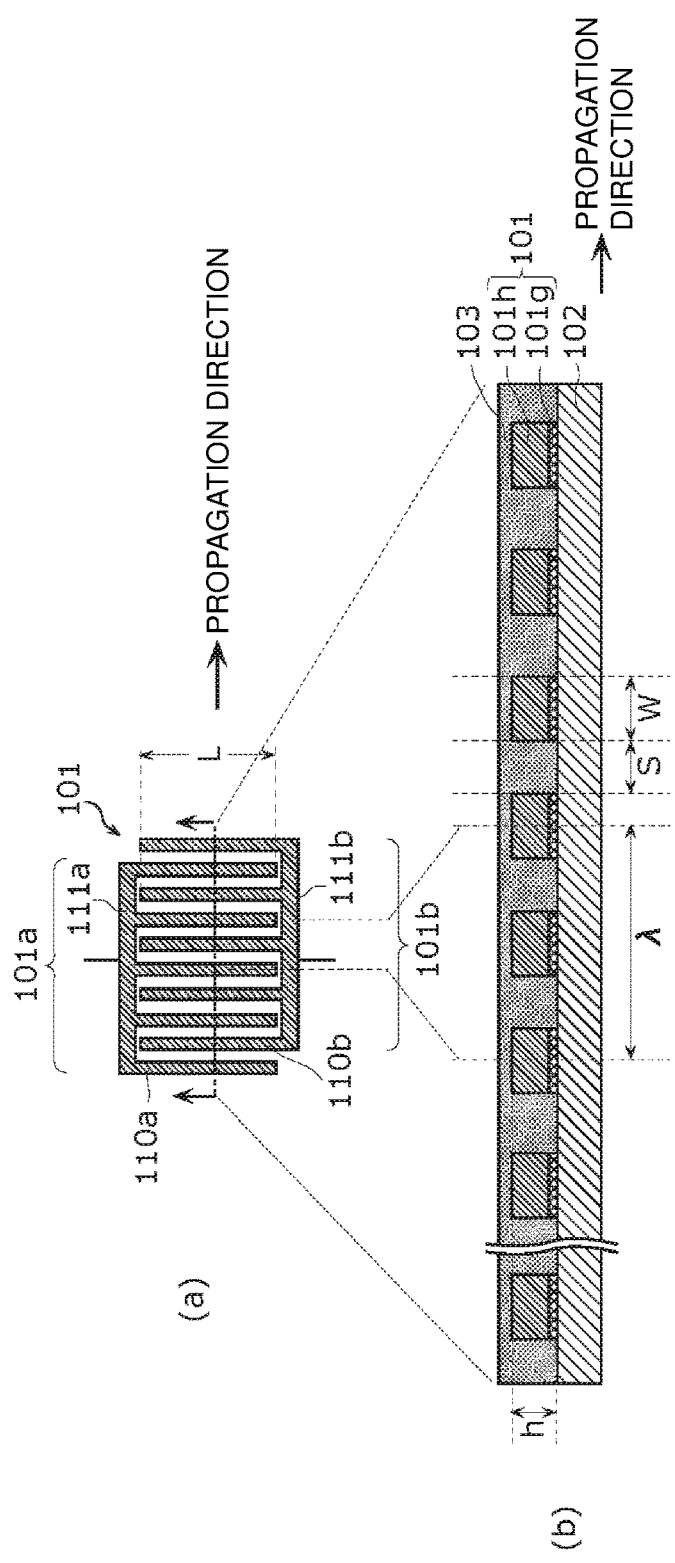
FIG. 2 schematically shows a structure of a resonator according to the first preferred embodiment of the present invention.

FIG. 2 schematically shows the structure of the resonator in this preferred embodiment, with (a) of FIG. 2 showing a plan view, and (b) of FIG. 2 showing a sectional view taken along a line indicated in (a). It is to be noted that the resonator shown in FIG. 2 is drawn with intent to explain a typical structure of each of the resonators included in the filter 10. Therefore, the number and the length of electrode fingers included in the IDT electrode of each resonator in the filter 10 are not limited to the number and the length of electrode fingers of the IDT electrode shown in FIG. 2. Reflectors included in the resonator are omitted from FIG. 2 for clarity and convenience.

As shown in (a) and (b) of FIG. 2, the resonator includes an IDT electrode 101, a piezoelectric substrate 102 on which the IDT electrode 101 is provided, and a protective layer 103 covering the IDT electrode 101.

As shown in (a) of FIG. 2, a pair of comb-shaped electrodes 101a and 101b defining the IDT electrode 101 and opposing to each other are provided on the piezoelectric substrate 102. The comb-shaped electrode 101a includes a plurality of electrode fingers 110a parallel or substantially parallel to one another, and by a bus bar electrode 111a interconnecting the electrode fingers 110a. The comb-shaped electrode 101b includes a plurality of electrode fingers 110b parallel or substantially parallel to one another, and by a bus bar electrode 111b interconnecting the electrode fingers 110b. The electrode fingers 110a and 110b extend along a direction that is perpendicular or substantially perpendicular to a propagation direction of an acoustic wave.

As shown in (b) of FIG. 2, the IDT electrode 101 defined by the electrode fingers 110a and 110b and the bus bar electrodes 111a and 111b includes a multilayer structure including a close contact layer 101g and a main electrode layer 101h.

The protective layer 103 covers the comb-shaped electrodes 101a and 101b. The protective layer 103 is a layer with aims of protecting the main electrode layer 101h from external environments, adjusting frequency-temperature characteristics, and increasing humidity resistance. The protective layer 103 is a film including, for example, silicon dioxide as a main component.

In the resonator (a surface acoustic wave resonator), a wavelength of an excited acoustic wave is specified by design parameters of the IDT electrode 101 and the like. In other words, the resonant frequency or the anti-resonant frequency in the resonator is specified by the design parameters of the IDT electrode 101 and the like. The design parameters of the IDT electrode 101, including the design parameters of the comb-shaped electrode 101a and the comb-shaped electrode 101b, are described below.

The series arm resonators s1 and s2 and the parallel arm resonator p1 may be each defined by a plurality of divided resonators that are divided in series, for example. Accordingly, the size of each of the series arm resonators s1 and s2 and the parallel arm resonator p1 is able to be increased. It is hence possible to significantly reduce power consumption in each of the series arm resonators s1 and s2 and the parallel arm resonator p1, and to significantly reduce or prevent distortion generated.

Filter characteristics of the filter 10 according to this preferred embodiment are described below.

First, filter characteristics of the bandpass filter 13 are described.

Figure 3:
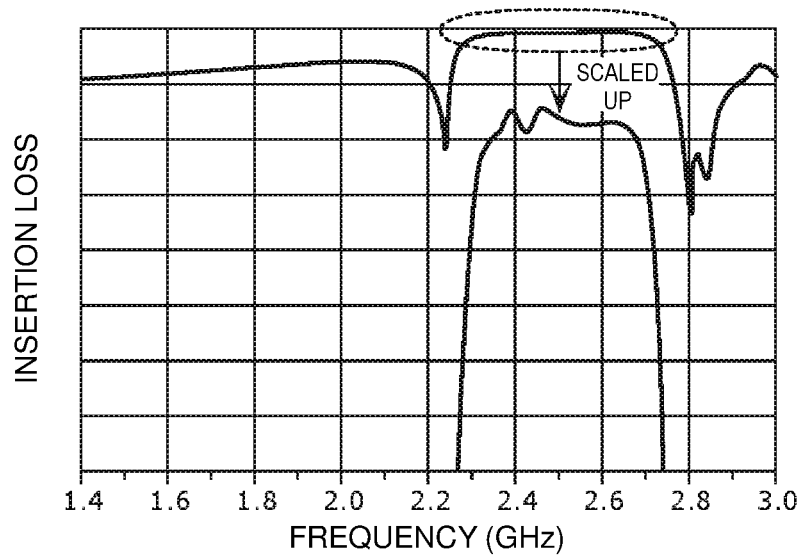
FIG. 3 is a graph showing filter characteristics of a bandpass filter according to the first preferred embodiment of the present invention.
Figure 4:
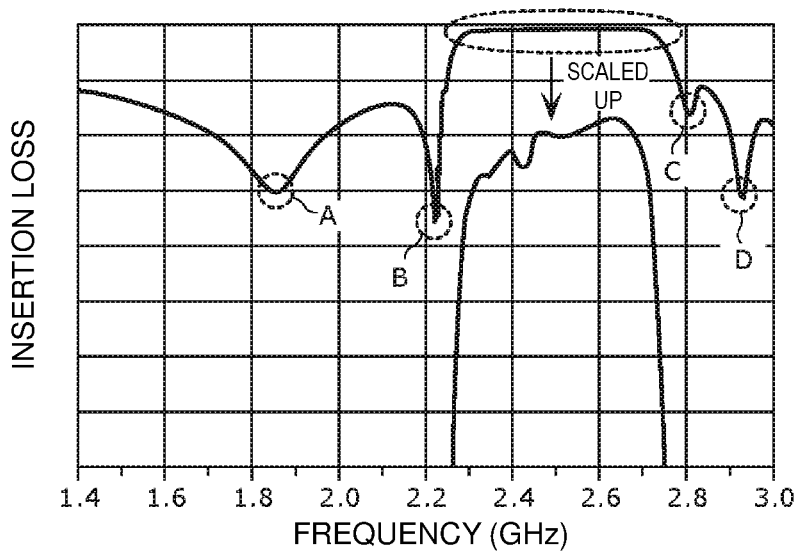
FIG. 4 is a graph showing filter characteristics of a filter according to the first preferred embodiment of the present invention.

FIG. 3 is a graph showing the filter characteristics of the bandpass filter 13 according to the first preferred embodiment. In FIGS. 3, 4, 6, 9 and 12A to 12C, an insertion loss is larger on the lower side along a vertical axis of each graph. FIG. 3 shows the filter characteristics of the band pass filter 13 in a state where the band pass filter 13 is not under an influence of the inductor L1 (i.e., in a state not under an influence of the LC resonant circuit 12). The series arm resonators s1 and s2 and the parallel arm resonator p1 operate as notch filters, and the resonant frequency of the parallel arm resonator p1 is set to be lower than the anti-resonant frequency of each of the series arm resonators s1 and s2. As a result, the pass band of the bandpass filter 13 is provided as shown in FIG. 3. In the shown filter characteristics, attenuation is relatively small in an attenuation band on the lower side than the pass band of the bandpass filter 13, and hence attenuation characteristics are not favorable. FIG. 4 shows bandpass characteristics of the bandpass filter 13 in a state where the band pass filter 13 is under the influence of the inductor L1 (i.e., bandpass characteristics of the filter 10).

FIG. 4 is a graph showing the filter characteristics of the filter 10 according to the first preferred embodiment. The respective anti-resonant frequencies of the two series arm resonators s1 and s2 and the resonant frequency of the parallel arm resonator p1 are spaced away from each other by adjusting the design parameters of the IDT electrodes 101 of each of the series arm resonators s1 and s2 and the parallel arm resonator p1. In a ladder filter, a bandpass is generally provided by setting a resonant frequency of a series arm resonator and an anti-resonant frequency of a parallel arm resonator to the same or substantially the same frequency. In this preferred embodiment, however, the respective anti-resonant frequencies of the two series arm resonators s1 and s2 are higher than the resonant frequency of the parallel arm resonator p1. More specifically, an attenuation pole indicated by a portion B in FIG. 4 (referred to as an attenuation pole B) corresponds to the resonant frequency of the parallel arm resonator p1, an attenuation pole indicated by a portion C (referred to as an attenuation pole C) corresponds to the anti-resonant frequency of the series arm resonator s1, and an attenuation pole indicated by a portion D (referred to as an attenuation pole D) corresponds to the anti-resonant frequency of the series arm resonator s2. The series arm resonators s1 and s2 and the parallel arm resonator p1 operate as notch filters. The attenuation pole B provides an attenuation slope on the lower frequency side of the pass band of the filter 10, and the attenuation poles C and D provide an attenuation slope on the higher frequency side of the pass band of the filter 10. The pass band of the LC resonant circuit 12 includes a fractional bandwidth of about 4.5% or more, for example, and spreads over frequencies corresponding to the attenuation poles B to D. In FIG. 4, the above-mentioned pass band is locally attenuated because the anti-resonant frequencies of the series arm resonators s1 and s2 and the resonant frequency of the parallel arm resonator p1 are located in the above-mentioned pass band. Since the series arm resonators s1 and s2 and the parallel arm resonator p1 are acoustic surface wave resonators, the attenuation slopes are relatively sharp. The filter 10 preferably is a bandpass filter with bandpass characteristics with a wide pass band defined by setting the attenuation pole B away from the attenuation poles C and D (for example, by setting the resonant frequency of the parallel arm resonator p1 away from the anti-resonant frequencies of the two series arm resonators s1 and s2). The term "wide pass band" indicates a pass band that is wider than that of a filter defined only by the acoustic wave resonator. The wide pass band is, for example, a band with a fractional width of about 4.5% or more and, preferably, a fractional width of about 7.5% or more.

The resonant frequency of the LC resonant circuit 12 is lower than that of the parallel arm resonator p1. An attenuation pole indicated by a portion A in FIG. 4 (referred to as an attenuation pole A) corresponds to the resonant frequency of the LC resonant circuit 12. With the presence of the attenuation pole A, an attenuation band range is able to be made wider on the lower frequency side than the pass band of the filter 10. The resonant frequency of the LC resonant circuit 12 is able to be adjusted by adjusting an inductance value of the inductor L1, and the attenuation pole given by the LC resonant circuit 12 is able to be spaced away from the pass band of the filter 10.

A branching filter that separates (e.g., branches) a radio frequency signal per frequency band may be provided for carrier aggregation (CA), for example. A multiplexer including a plurality of filters is proposed as the above-mentioned branching filter. In such a multiplexer, terminals at respective one ends of individual filters are electrically connected together directly or via a phase shifter or a filter selection switch, thus providing a common terminal. This enables characteristics of one filter to affect characteristics of another filter. Thus, the characteristics of one filter, which cause no problems on the one filter itself, may provide a factor degrading the characteristics of another filter, for example. More specifically, attenuation characteristics in an attenuation band on the lower frequency side than the pass band of one filter provide no influences on bandpass characteristics of the one filter within the pass band thereof. However, when the frequency in the above-mentioned attenuation band is located within the pass band of another filter, this provides a factor degrading bandpass characteristics of the other filter within the pass band thereof if the attenuation in the above-mentioned attenuation band of the one filter is small.

As shown in FIG. 4, the filter 10 provides attenuation characteristics in which an attenuation band is present, for example, in a middle band (about 1710 MHz to about 2200 MHz) located on the lower frequency side than the pass band of the filter 10. For example, if one filter of the above-mentioned multiplexer is the filter 10 and another filter thereof is a filter with a pass band given by the above-mentioned middle band, if the attenuation in the attenuation band of the filter 10 is small, bandpass characteristics of the other filter may degrade in the pass band thereof, for example. However, the attenuation in the attenuation band on the lower frequency side than the pass band of the filter 10 is increased over a wide range with the presence of the attenuation pole A that corresponds to the resonant frequency of the LC resonant circuit 12. Accordingly, degradation in the bandpass characteristics of the other filter is able to be significantly reduced or prevented.

Characteristics of a bandpass filter with a wide pass band are also able to be implemented with a filter including different features or elements from the filter 10. As Comparative Example 1, a filter 100, which is a bandpass filter with a wide pass band, is described below.

Figure 5:
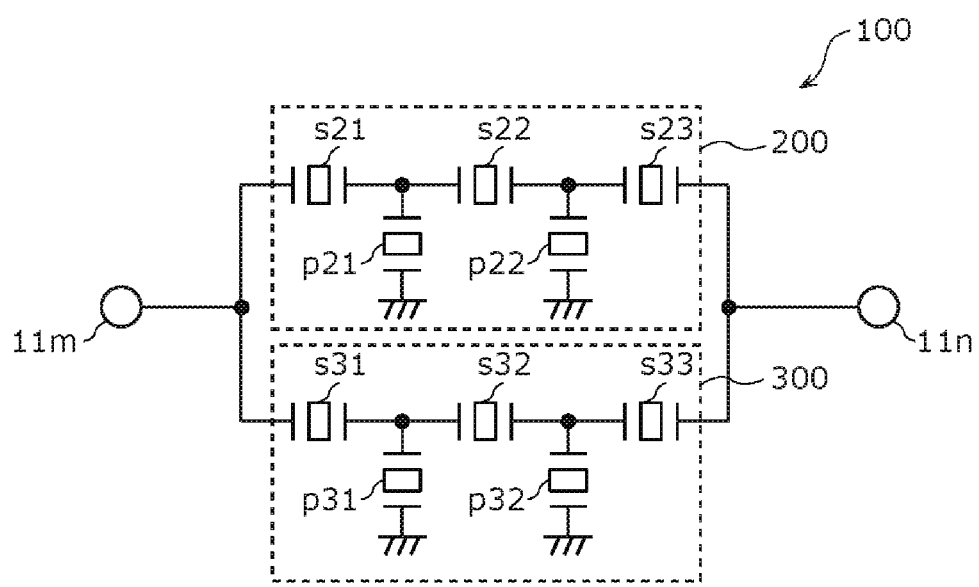
FIG. 5 is a circuit diagram of a filter according to Comparative Example 1.

FIG. 5 is a circuit diagram of the filter 100 according to Comparative Example 1. As shown in FIG. 5, the filter 100 includes ladder filters 200 and 300 that are electrically connected in parallel to each other. The filter 200 includes series arm resonators s21 to s23 and parallel arm resonators p21 and p22, and the filter 300 includes series arm resonators s31 to s33 and parallel arm resonators p31 and p32.

Each of the series arm resonators s1 and s2 and the parallel arm resonator p1 is a surface acoustic wave resonator, for example.

Figure 6:
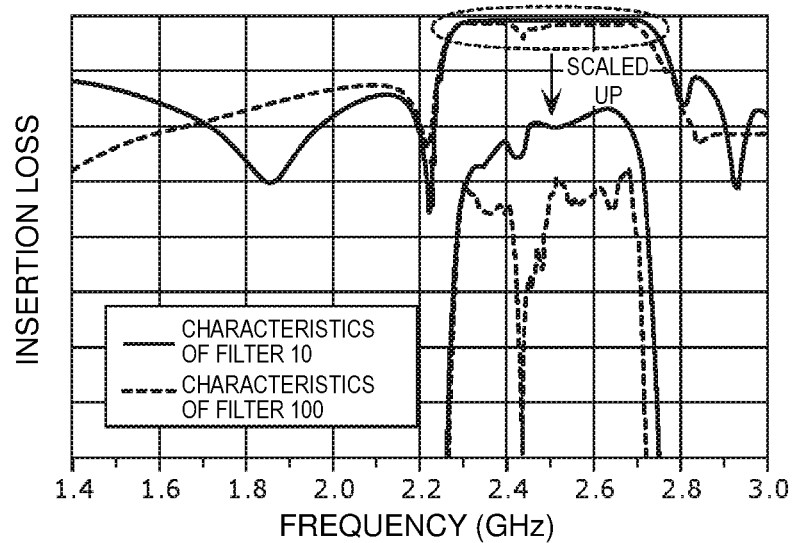
FIG. 6 is a graph showing respective filter characteristics of the filter according to the first preferred embodiment of the present invention and the filter according to Comparative Example 1.

FIG. 6 is a graph showing respective filter characteristics of the filter 10 according to the first preferred embodiment and the filter 100 according to Comparative Example 1. A solid line represents the characteristics of the filter 10, and a dotted line represents the characteristics of the filter 100. Generally, a filter in which surface acoustic wave resonators are included and in which a passband is provided by setting a resonant frequency of a series arm resonator and an anti-resonant frequency of a parallel arm resonator to the same or substantially the same frequency, includes a fractional bandwidth of about 3% to about 4%, and a loss in the pass band is increased when a bandwidth of the filter is widened. Thus, bandpass-type filter characteristics with a wide pass band are able to be provided by including a plurality of filters of which pass bands are different from each other, as in the filter 100. In an example, the filter 200 includes filter characteristics with a pass band of Band 40 (about 2300 MHz to about 2400 MHz), and the filter 300 includes filter characteristics with a pass band of Band 41 (about 2496 MHz to about 2690 MHz). The filter characteristics of the filter 100 are provided by combined characteristics of both the filters 200 and 300. However, even when the bandpass-type filter characteristics with the wide pass band is provided by including the plurality of filters, a pass band with such a small loss as provided with the filter 10 are not able to be provided, as shown in FIG. 6. It is also shown in FIG. 6 that, in the filter 100, a large attenuation in the attenuation band is not provided over a wide range on the lower frequency side of the pass band.

Furthermore, in the filter 10 according to this preferred embodiment, the high frequency signal leaks to the inductor L1. In other words, the high frequency signal flowing through the series arm resonators s1 and s2 and the parallel arm resonator p1 is significantly reduced. As a result, power consumption by the series arm resonators s1 and s2 and the parallel arm resonator p1 is significantly reduced, and generated distortion is able to be significantly reduced or prevented.

Figure 7:
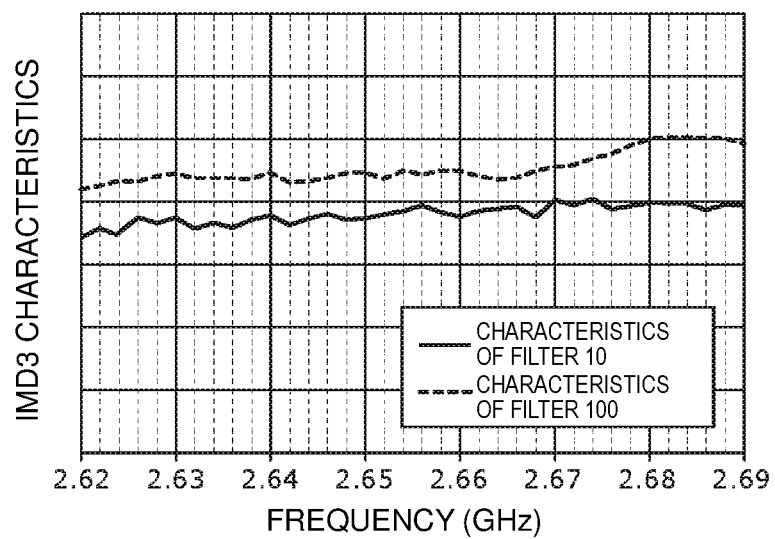
FIG. 7 is a graph showing respective third-order intermodulation distortion (IMD3) characteristics of the filter according to the first preferred embodiment of the present invention and the filter according to Comparative Example 1.

FIG. 7 is a graph showing respective third-order intermodulation distortion (IMD3) characteristics of the filter 10 according to the first preferred embodiment and the filter 100 according to Comparative Example 1. In FIG. 7, the lower side of a vertical axis of the graph represents more favorable IMD3 characteristics. More specifically, FIG. 7 shows the IMD3 characteristics in Band 7. In the filter 100, substantially all of the high frequency signal flows through the resonators unlike the filter 10, and hence power consumption by the resonators is increased. Thus, as shown in FIG. 7, the IMD3 characteristics of the filter 10 are significantly improved in comparison with IMD3 characteristics of the filter 100.

As described above, the filter 10 provides the bandpass-type filter characteristics of the wide pass band and a smaller loss than that generated in the filter 100 according to Comparative Example 1.

In addition, the attenuation in the predetermined band of the filter 10 is able to be increased depending on the specific elements included in and the structure of the matching circuit 14, and bandpass characteristics of another filter that provides a pass band in the same range or a similar range as the predetermined band of the filter 10 are able to be significantly improved.

FIGS. 8A to 8I are each a circuit diagram showing an example of the matching circuit 14.

Figure 8A:
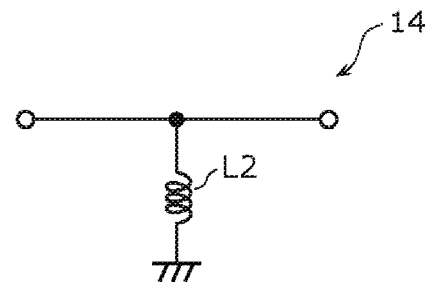
FIG. 8A is a circuit diagram showing an example of a matching circuit according to the first preferred embodiment of the present invention.

As shown in FIG. 8A, the matching circuit 14 may be an inductor L2 electrically connected between the ground and a junction between the input/output terminal 11m and the input/output terminal 11n, for example. The inductor L2 is an example of a second inductor. By adjusting circuit parameters with the above-described features and elements, the matching circuit 14 is able to define and function as a filter that attenuates a low band (about 699 MHz to about 960 MHz), for example. Accordingly, bandpass characteristics of another filter with a pass band in the low band are able to be significantly improved.

Figure 8B:
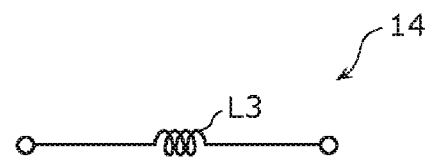
FIG. 8B is a circuit diagram showing an example of the matching circuit according to the first preferred embodiment of the present invention.

As shown in FIG. 8B, the matching circuit 14 may be an inductor L3 electrically connected in series between the input/output terminal 11m and the input/output terminal 11n, for example. The inductor L3 is an example of a third inductor. By adjusting the circuit parameters with the above-described features and elements, the matching circuit 14 is able to define and function as a filter that attenuates a frequency band of about 5 GHz, for example. Accordingly, bandpass characteristics of another filter with a pass band in the frequency band of about 5 GHz are able to be significantly improved.

Figure 8C:
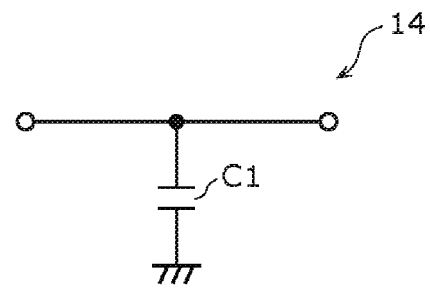
FIG. 8C is a circuit diagram showing an example of the matching circuit according to the first preferred embodiment of the present invention.
Figure 8D:
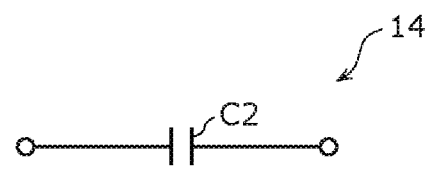
FIG. 8D is a circuit diagram showing an example of the matching circuit according to the first preferred embodiment of the present invention.

The matching circuit 14 may be a capacitor C1 electrically connected between the ground and the junction between the input/output terminal 11m and the input/output terminal 11n as shown in FIG. 8C, or a capacitor C2 electrically connected in series between the input/output terminal 11m and the input/output terminal 11n as shown in FIG. 8D, for example.

Figure 8E:
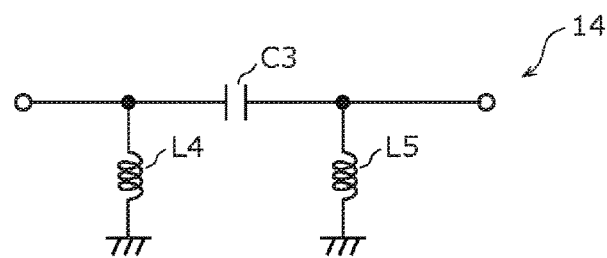
FIG. 8E is a circuit diagram showing an example of the matching circuit according to the first preferred embodiment of the present invention.
Figure 8F:
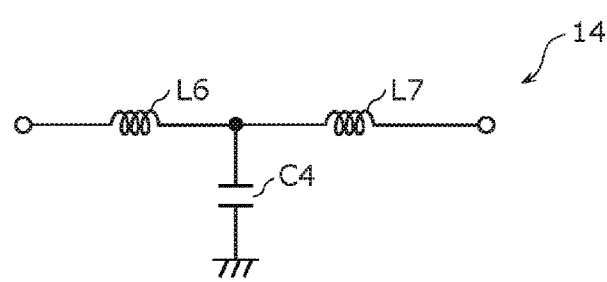
FIG. 8F is a circuit diagram showing an example of the matching circuit according to the first preferred embodiment of the present invention.

The matching circuit 14 may include a 7L-type circuit with a capacitor C3 and inductors L4 and L5 as shown in FIG. 8E, or a T-type circuit with a capacitor C4 and inductors L6 and L7 as shown in FIG. 8F, for example.

Figure 8G:
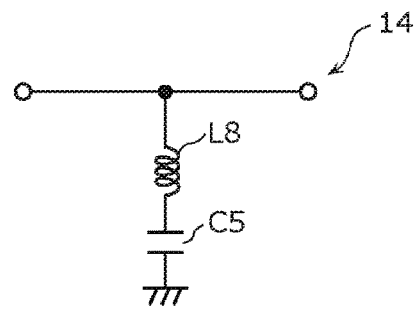
FIG. 8G is a circuit diagram showing an example of the matching circuit according to the first preferred embodiment of the present invention.
Figure 8H:
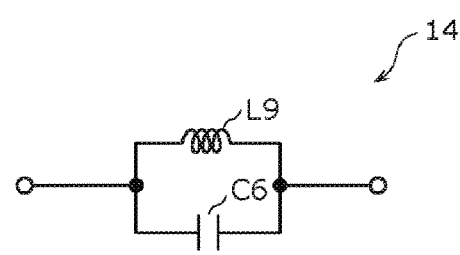
FIG. 8H is a circuit diagram showing an example of the matching circuit according to the first preferred embodiment of the present invention.

The matching circuit 14 may include a series resonant circuit with a capacitor C5 and an inductor L8 as shown in FIG. 8G, or a parallel resonant circuit with a capacitor C6 and an inductor L9 as shown in FIG. 8H, for example.

Figure 8I:
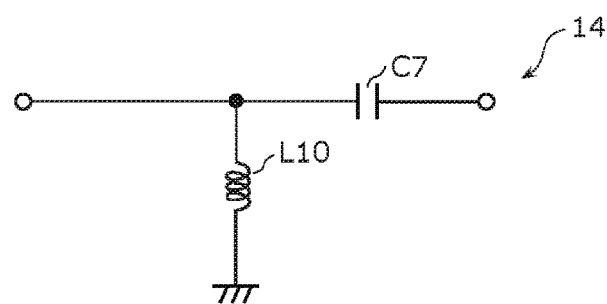
FIG. 8I is a circuit diagram showing an example of the matching circuit according to the first preferred embodiment of the present invention.

Moreover, the matching circuit 14 may include a circuit with a capacitor C7 and an inductor L10 as shown in FIG. 8I, for example.

Thus, the attenuation in the predetermined band of the filter 10 is able to be increased, and bandpass characteristics of another filter with a pass band in the same range or a similar range as the predetermined band of the filter 10 are able to be significantly improved by providing the matching circuit 14 as shown in FIGS. 8C to 8I, and by adjusting the circuit parameters.

Regarding the substrates including piezoelectric layers that are included in the series arm resonators s1 and s2 and the parallel arm resonator p1, the following description is provided with respect to relationships between piezoelectric materials and cut angles of the piezoelectric layers and the bandpass characteristics of the filter 10.

The series arm resonators s1 and s2 and the parallel arm resonator p1 are each defined by the substrate including the piezoelectric layer, and by the IDT electrode provided on the substrate. A filter according to Example 1 in which respective piezoelectric materials of the piezoelectric layers included in the series arm resonators s1 and s2 and the parallel arm resonator p1 are different, and a filter according to Comparative Example 2 in which the same or similar piezoelectric materials are included are described below. In Comparative Example 2, an LN Love wave is provided to each of the parallel arm resonator p1 and the series arm resonators s1 and s2. In Example 1, an LN Rayleigh wave is provided to the parallel arm resonator p1, and an LN Love wave is provided to each of the series arm resonators s1 and s2.

Figure 9:
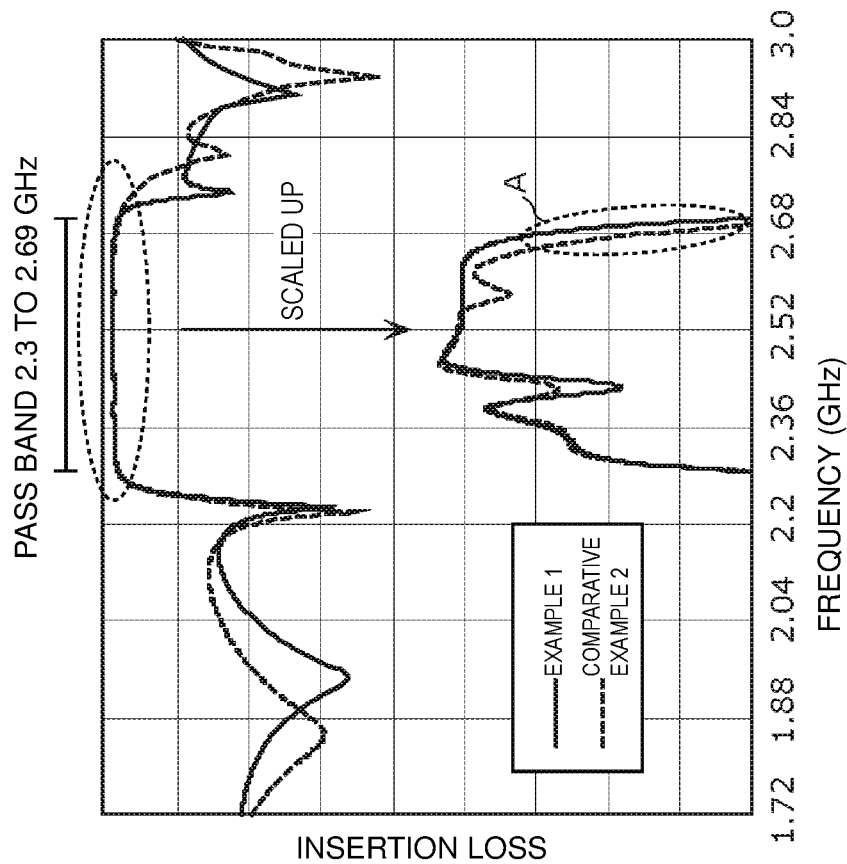
FIG. 9 is a graph showing respective filter characteristics of a filter according to Example 1 and a filter according to Comparative Example 2.
Figure 10:
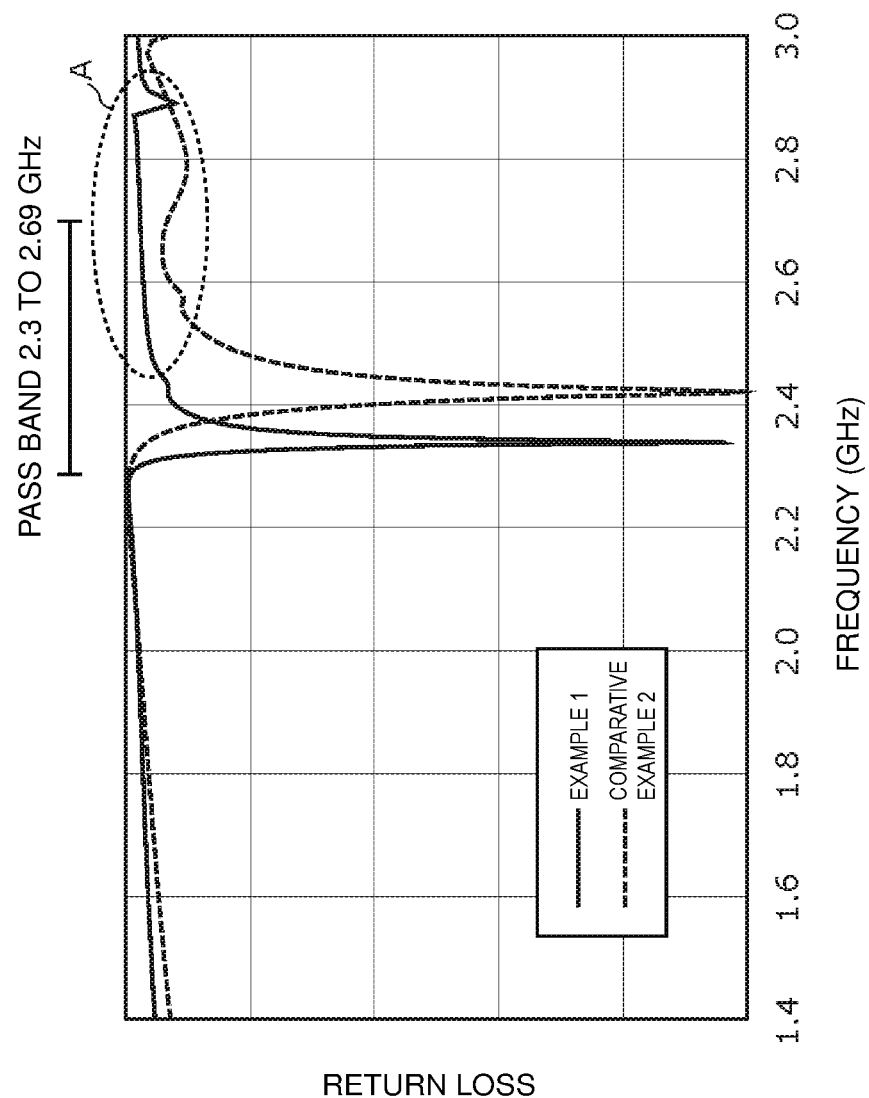
FIG. 10 is a graph showing respective resonator characteristics of a parallel arm resonator according to Example 1 and a parallel arm resonator according to Comparative Example 2.

FIG. 9 is a graph showing respective filter characteristics of the filter according to Example 1 and the filter according to Comparative Example 2. In FIG. 9, a solid line represents the characteristics of the filter according to Example 1, and a dotted line represents the characteristics of the filter according to Comparative Example 2. FIG. 10 is a graph showing respective resonator characteristics of the parallel arm resonator p1 according to Example 1 and the parallel arm resonator p1 according to Comparative Example 2. In FIG. 10, a solid line represents the resonator characteristics of the parallel arm resonator p1 according to Example 1, and a dotted line represents the resonator characteristics of the parallel arm resonator p1 according to Comparative Example 2. In FIG. 10, a return loss is smaller on the lower side along a vertical axis of the graph.

In the case where the piezoelectric materials of the resonators are the same as or similar to Comparative Example 2, an unwanted wave (e.g., a bulk wave) is generated due to the piezoelectric materials and a loss in the passband of the filter is increased in comparison with the case where the piezoelectric materials of the resonators are different as in Example 1. As shown by a region A in FIG. 9, for example, the loss is greatly increased near about 2.69 GHz in the pass band. As shown by a region A in FIG. 10, in Example 1, since the piezoelectric material of the parallel arm resonator p1 is different from that of the series arm resonators s1 and s2, a return loss is large near about 2.69 GHz, and preferably kept close to 0 dB, by way of example. On the other hand, in Comparative Example 2, since the piezoelectric material of the parallel arm resonator p1 is the same as or similar to that of the series arm resonators s1 and s2, a return loss is, by way of example, as small as about −3 dB near about 2.69 GHz, and it departs away from 0 dB. Such a result is affected by generation of the unwanted wave.

As described above, the loss in the pass band of the filter 10 is able to be significantly reduced by including different piezoelectric materials as the piezoelectric layers that are included in the parallel arm resonator p1 and the series arm resonators s1 and s2.

For the substrates including the piezoelectric layers that are included in the series arm resonators s1 and s2 and the parallel arm resonator p1, a similar effect to that described above is also able to be provided by setting cut angles of the piezoelectric layers to be different from each other. More specifically, in the case where the cut angles are the same or substantially the same, an unwanted wave is generated due to the cut angles and the loss in the passband of the filter is increased in comparison with the case where the cut angles are different. However, the loss in the passband of the filter is able to be significantly reduced by setting the cut angles to be different from each other.

In the filter 10 (a filter device) according to the first preferred embodiment, as described above, the two series arm resonators s1 and s2 and the inductor L1 (a first inductor) define the LC resonant circuit 12 with the wide pass band. Furthermore, the respective anti-resonant frequencies of the two series arm resonators s1 and s2 and the resonant frequency of the parallel arm resonator p1 are located in the pass band of the LC resonant circuit 12, and the individual resonators operate as notch filters and locally attenuate the pass band of the LC resonant circuit 12. On that occasion, since the respective anti-resonant frequencies of the two series arm resonators s1 and s2 are higher than the resonant frequency of the parallel arm resonator p1, the parallel arm resonator p1 provides the attenuation slope on the lower frequency side of the pass band of the filter 10, and the two series arm resonators s1 and s2 provide the attenuation slope on the higher frequency side of the pass band thereof. Accordingly, the pass band of the filter 10 is able to be widened by setting the respective anti-resonant frequencies of the two series arm resonators s1 and s2 and the resonant frequency of the parallel arm resonator p1 farther away from each other. Moreover, the loss in the relevant pass band is able to be significantly reduced with adjustment using the matching circuit 14. As a result, the bandpass-type filter characteristics of the wide pass band and the smaller loss are able to be provided.

Since the resonant frequency of the LC resonant circuit 12 is lower than the resonant frequency of the parallel arm resonator p1, the attenuation band on the lower frequency side of the pass band of the filter 10 is able to be widened, and the attenuation on that lower frequency side is able to be increased.

Moreover, depending on the circuitry of the matching circuit 14, the matching circuit 14 are able to define and function as, for example, a filter attenuating the low band (about 699 MHz to about 960 MHz), or as a filter attenuating a frequency band of about 5 GHz.

In addition, the loss in the pass band of the filter 10 is able to be significantly reduced by setting, in the substrates including the piezoelectric layers that are included in the series arm resonators s1 and s2 and the parallel arm resonator p1, the piezoelectric materials or the cut angles of the piezoelectric layers to be different from each other.

Second Preferred Embodiment

The filter 10 described in the first preferred embodiment is able to be applied to a multiplexer, a high frequency front-end circuit, a communication device, and the like. A second preferred embodiment of the present invention is described primarily with respect to a multiplexer that includes a plurality of filters including, as at least one of the plurality of filters, the filter 10 described in the first preferred embodiment. In the relevant multiplexer, input terminals or output terminals of the plurality of filters are directly or indirectly electrically connected to a common terminal.

Figure 11:
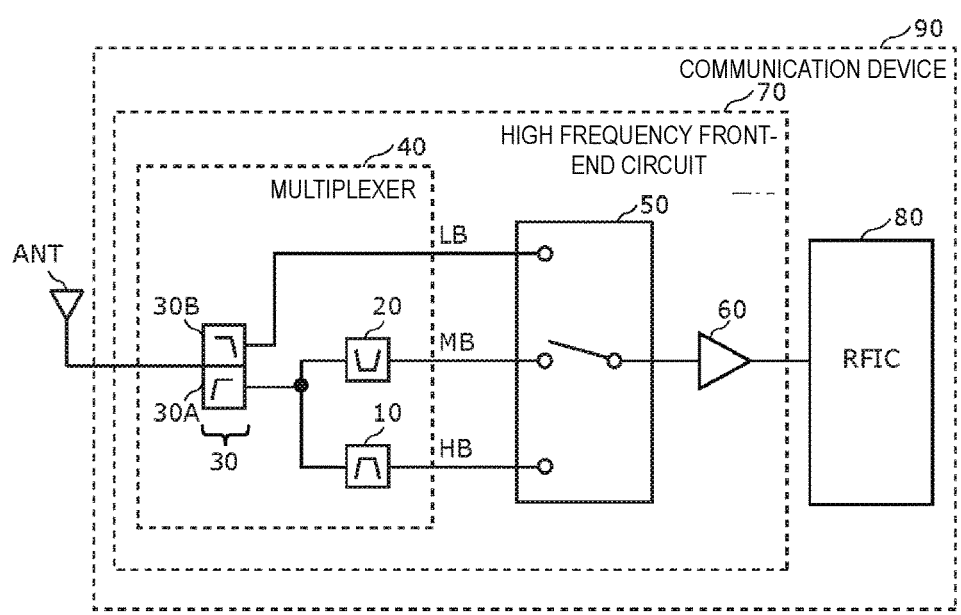
FIG. 11 is a block diagram of a multiplexer according to a second preferred embodiment of the present invention and a peripheral circuit thereof.

FIG. 11 is a block diagram of a multiplexer 40 according to the second preferred embodiment and a peripheral circuit thereof. FIG. 11 shows not only a high frequency front-end circuit 70 including the multiplexer 40, but also an antenna element ANT and an RF signal processing circuit (RFIC) 80. The high frequency front-end circuit 70 and the RFIC 80 define a communication device 90. The antenna element ANT, the high frequency front-end circuit 70, and the RFIC 80 are arranged, for example, in a front end portion of a multi-mode/multi-band cellular phone.

The antenna element ANT is, for example, a multi-band antenna that transmits and receives high frequency signals, and that is preferably able to transmit and receive signals in accordance with communication standards, such as LTE. The antenna element ANT may not be able to transmit and/or receive all bands of the communication device 90 in some cases, or may be able to transmit and/or receive only for a band of a lower frequency band group or a higher frequency band group in other cases, for example. Furthermore, the antenna element ANT may be included in the communication device 90, for example.

The high frequency front-end circuit 70 is a circuit that transfers a high frequency signal between the antenna element ANT and the RFIC 80. More specifically, the high frequency front-end circuit 70 transfers a high frequency signal received by the antenna element ANT (i.e., a received high-frequency signal) to the RFIC 80 via a reception-side signal path.

The high frequency front-end circuit 70 includes the multiplexer 40, a switch 50, and an amplifier circuit 60.

The multiplexer 40 includes three filters as a plurality of filters, including the filter 10 according to the first preferred embodiment, a filter 20, and a diplexer 30. The multiplexer 40 is able to be provided, by way of example, for CA in which signals in a plurality of frequency bands corresponding respectively to the plurality of filters are transmitted and received at the same or substantially the same time. The filter 20 is a band elimination filter in this preferred embodiment. Thus, the filter 20 is another filter with respect to the filter 10 and is defined by a surface acoustic wave resonator, for example. The diplexer 30 includes a high-pass filter 30A and a low-pass filter 30B (a low band filter), and these filters are each defined by an LC filter, for example. Terminals at respective one ends of the high-pass filter 30A and the low-pass filter 30B are joined into one common terminal that is then electrically connected to the antenna element ANT. The filter 20 is electrically connected to the input/output terminal 11m to which the filter 10 is electrically connected. In other words, terminals at respective one ends of the filter 10 and the filter 20 are joined into one common terminal, i.e., the input/output terminal 11m, which is then electrically connected to a terminal at the other end of the high-pass filter 30A. With the individual filters of the multiplexer 40 being electrically connected as described above, the multiplexer 40 is a triplexer.

A pass band of the low-pass filter 30B is assigned, for example, to the low band (about 699 MHz to about 960 MHz), and a pass band of the high-pass filter 30A is assigned, for example, to at least the middle band and the high band (about 1710 MHz to about 2690 MHz).

The pass band of the filter 10 is assigned, for example, to the high band (about 2300 MHz to about 2690 MHz). Frequencies of a pass band of the filter 20 are different from frequencies of a pass band of the filter 10, and the pass band of the filter 20 is assigned, for example, to the middle band (about 1710 MHz to about 2200 MHz). More specifically, the pass band of the filter 10 and the pass band of the filter 20 are different from each other in such a fashion that the filter 20 (a band elimination filter) provides an attenuation band overlapping the pass band of the filter 10, and that the pass band of the filter 20 is located on the lower frequency side than the above attenuation band. Thus, the attenuation band of the filter 20 is located in the high band (about 2300 MHz to about 2690 MHz) that is the same or substantially the same as the pass band of the filter 10, and the pass band of the filter 20 is located in the middle band (about 1710 MHz to about 2200 MHz) that is portion of the pass band (about 1710 MHz to about 2690 MHz) of the high-pass filter 30A, the portion being located on the lower frequency side than the high band (about 2300 MHz to about 2690 MHz).

According to the multiplexer 40, filter characteristics with a smaller loss are able to be provided by including the filter 10 as described above.

The terminal at the other end of the low-pass filter 30B, the terminal at the other end of the filter 10, and the terminal at the other end of the filter 20 are individually electrically connected to the switch 50.

The switch 50 is electrically connected to the multiplexer 40, and it selectively connects signal paths corresponding to a plurality of bands (i.e., the low band, the middle band, and the high band), which include different frequency bands from one another, to the amplifier circuit 60 in accordance with a control signal from a controller (not shown).

The amplifier circuit 60 is, for example, a low noise amplifier that is electrically connected to the multiplexer 40 via the switch 50, and that amplifies power of the received high-frequency signal received by the antenna element ANT.

The RFIC 80 is an RF signal processing circuit that processes the high frequency signals transmitted from and received by the antenna element ANT. More specifically, the RFIC 80 performs signal processing, such as down-conversion, of the high frequency signal (i.e., the received high-frequency signal) input from the antenna element ANT via the reception-side signal path of the high frequency front-end circuit 70, and outputs the received signal produced after the signal processing to a base-band signal processing circuit (not shown).

Bandpass characteristics of the signal paths corresponding to the plurality of bands (i.e., the low band, the middle band, and the high band), which include different frequency bands from one another, in the multiplexer 40 are described below.

Figure 12A:
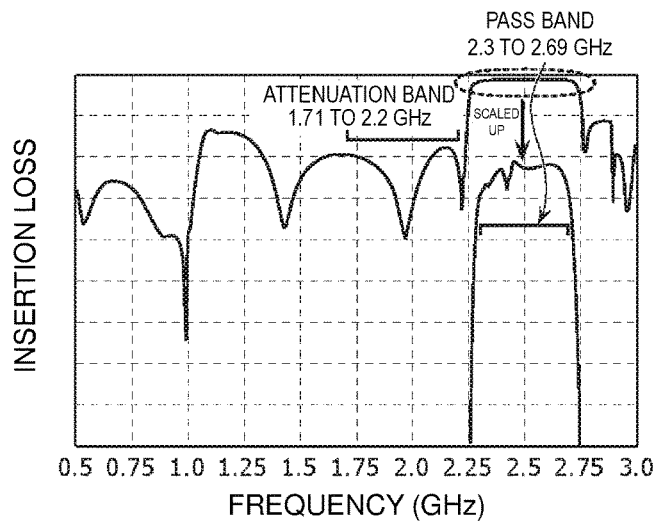
FIG. 12A is a graph showing bandpass characteristics of a signal path corresponding to a high band in the multiplexer according to the second preferred embodiment of the present invention.
Figure 12B:
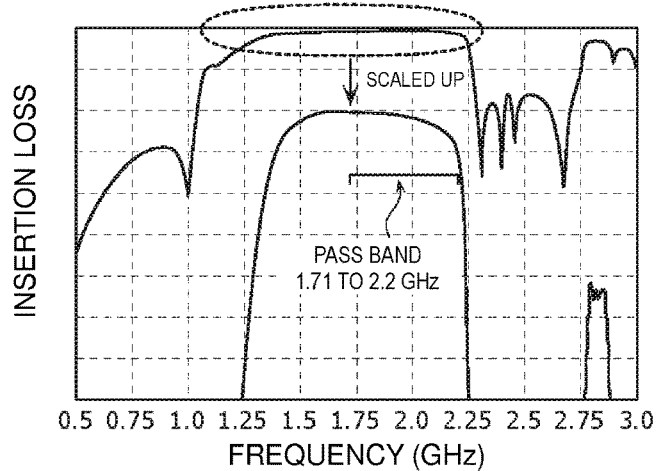
FIG. 12B is a graph showing bandpass characteristics of the signal path corresponding to a middle band in the multiplexer according to the second preferred embodiment of the present invention.
Figure 12C:
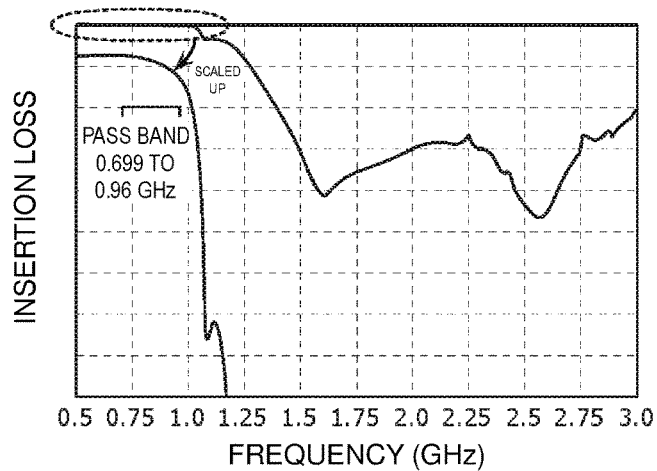
FIG. 12C is a graph showing bandpass characteristics of the signal path corresponding to a low band in the multiplexer according to the second preferred embodiment of the present invention.

FIG. 12A is a graph showing the bandpass characteristics of the signal path corresponding to the high band in the multiplexer 40 according to the second preferred embodiment. FIG. 12B is a graph showing the bandpass characteristics of the signal path corresponding to the middle band in the multiplexer 40 according to the second preferred embodiment. FIG. 12C is a graph showing the bandpass characteristics of the signal path corresponding to the low band in the multiplexer 40 according to the second preferred embodiment. The signal path corresponding to the high band is a signal path passing through the high-pass filter 30A and the filter 10. The signal path corresponding to the middle band is a signal path passing through the high-pass filter 30A and the filter 20. The signal path corresponding to the low band is a signal path passing through the low-pass filter 30B.

As shown in FIGS. 12A and 12B, a pass band of the signal path corresponding to the high band and an attenuation band of the signal path corresponding to the middle band are overlapped with each other in about 2300 MHz to about 2690 MHz. It is also shown in FIGS. 12A and 12B that the resonant frequency of the LC resonant circuit 12 in the filter 10 is located in the pass band of the filter 20, and hence that an attenuation band of the signal path corresponding to the high band and a pass band of the signal path corresponding to the middle band are overlapped with each other in about 1710 MHz to about 2200 MHz, for example. The resonant frequency of the LC resonant circuit 12 is located near a center frequency of the pass band of the filter 20. Preferably, the resonant frequency of the LC resonant circuit 12 is located on the lower frequency side than the center frequency of the pass band of the filter 20. With such setting, the resonant point of the LC resonant circuit 12 is located far away from the pass band of the filter 10. Accordingly, the pass band of the filter 10 is less affected by the resonant point of the LC resonant circuit 12, and the loss in the pass band of the filter 10 is able to be significantly reduced.

As shown in FIG. 12C, a pass band of the signal path corresponding to the low band includes a different frequency range from the pass band of the signal path corresponding to the high band and from the pass band of the signal path corresponding to the middle band, and an attenuation band of that signal band on the higher frequency side than the pass band of the signal path corresponding to the low band is overlapped with both the pass band of the signal path corresponding to the high band and the pass band of the signal path corresponding to the middle band.

Thus, in the multiplexer 40, the pass band of the signal path corresponding to the high band is located outside the respective pass bands of the signal paths corresponding to the middle band and the low band, the pass band of the signal path corresponding to the middle band is located outside the respective pass bands of the signal paths corresponding to the high band and the low band, and the pass band of the signal path corresponding to the low band is located outside the respective pass bands of the signal paths corresponding to the high band and the middle band. As a result, the multiplexer 40 is able to be provided for the CA in which signals in a plurality of frequency bands are transmitted and received at the same or substantially the same time.

Other Preferred Embodiments

While the filter devices and the multiplexers according to the preferred embodiments of the present invention have been described above with respect to the first and second preferred embodiments, the present invention is not limited to the above preferred embodiments. The present invention further includes other preferred embodiments provided by optionally combining the elements in the above preferred embodiments, and modifications provided by variously modifying, on the basis of ideas conceived by those skilled in the art, the above preferred embodiments within the scope not departing from the gist of the present invention, as well as various devices including the filter device and the multiplexer according to the preferred embodiments of the present invention.

For example, not only the high frequency front-end circuit 70, but also the communication device 90 including the high frequency front-end circuit 70 and the RFIC 80 (an RF signal processing circuit) are further included in the scope of the present invention.

As another example, while the filter 10 preferably includes two series arm resonators s1 and s2 in the above preferred embodiments, the filter 10 may include three or more series arm resonators, for example.

As still another example, while the filter 10 preferably includes one parallel arm resonator p1 in the above preferred embodiments, the filter 10 may include two or more parallel arm resonators.

As still another example, while the high frequency front-end circuit 70 preferably includes the reception-side signal path in the second preferred embodiment, the high frequency front-end circuit 70 may include a transmission-side signal path and may transfer a high frequency signal output from the RFIC 80 (i.e., a transmitted high-frequency signal) to the antenna element ANT via the transmission-side signal path. In that case, the RFIC 80 may perform signal processing, for example, up-conversion, of the transmitted signal input from the base-band signal processing circuit, and may output the transmitted signal (i.e., the transmitted high-frequency signal) produced after the signal processing to the transmission-side signal path of the high frequency front-end circuit 70. The amplifier circuit 60 may be a power amplifier that amplifies power of the transmitted high-frequency signal output from the RFIC 80, for example.

As still another example, while the multiplexer 40 preferably is a triplexer including three filters in the second preferred embodiment, the multiplexer 40 may be a diplexer including two filters, a quadplexer including four filters, or the like insofar as including the filter 10.

As still another example, while the high frequency front-end circuit 70 includes one switch 50 and one amplifier circuit 60 in the second preferred embodiment, the high frequency front-end circuit 70 may include a plurality of switches and a plurality of amplifier circuits. Alternatively, the high frequency front-end circuit 70 may include neither the switch 50 nor the amplifier circuit 60, for example.

Preferred embodiments of the present invention are able to be implemented as filters, multiplexers, front-end circuits, and communication devices, which are able to be included in a multi-band system, and are able to be widely applied to communication devices such as cellular phones.

While preferred embodiments of the present invention have been described above, it is to be understood that variations and modifications will be apparent to those skilled in the art without departing from the scope and spirit of the invention. The scope of the present invention, therefore, is to be determined solely by the following claims.

What is claimed is:

1. A filter device comprising:
   a first series arm resonator and a second series arm resonator electrically connected in series between a first terminal and a second terminal, the first series arm resonator being located on a side closer to the first terminal, the second series arm resonator being located on a side closer to the second terminal;
   a parallel arm resonator electrically connected between a ground and a series arm between the first series arm resonator and the second series arm resonator;
   a first inductor electrically connected in parallel to the first series arm resonator and the second series arm resonator; and
   a matching circuit electrically connected between the second series arm resonator and the second terminal or between the first series arm resonator and the first terminal; wherein
   the first series arm resonator, the second series arm resonator, and the parallel arm resonator define a pass band of a bandpass filter;
   the first series arm resonator, the second series arm resonator, and the first inductor define an LC resonant circuit;
   respective anti-resonant frequencies of each of the first series arm resonator and the second series arm resonator and a resonant frequency of the parallel arm resonator are located in a pass band of the LC resonant circuit; and
   a resonant frequency of the LC resonant circuit is lower than the resonant frequency of the parallel arm resonator.

2. The filter device according to claim 1, wherein the resonant frequency of the parallel arm resonator is lower than the respective anti-resonant frequencies of each of the first series arm resonator and the second series arm resonator.

3. The filter device according to claim 1, wherein the matching circuit is a second inductor electrically connected between the ground and a junction between the first terminal and the second terminal.

4. The filter device according to claim 1, wherein the matching circuit is a third inductor electrically connected in series between the first terminal and the second terminal.

5. The filter device according to claim 1, wherein:
   each of the parallel arm resonator, the first series arm resonator, and the second series arm resonator includes a substrate including a piezoelectric layer, and an IDT electrode provided on the substrate; and a piezoelectric material of the piezoelectric layer included in the parallel arm resonator is different from a piezoelectric material of each of the piezoelectric layers included in the first series arm resonator and the second series arm resonator.

6. The filter device according to claim 1, wherein:
each of the parallel arm resonator, the first series arm resonator, and the second series arm resonator includes a substrate including a piezoelectric layer, and an IDT electrode provided on the substrate; and
a cut angle of the piezoelectric layer included in the parallel arm resonator is different from a cut angle of each of the piezoelectric layers included in the first series arm resonator and the second series arm resonator.

7. The filter device according to claim 1, wherein at least one of the parallel arm resonator, the first series arm resonator, and the second series arm resonator is a Bulk Acoustic Wave resonator or a Film Bulk Acoustic Resonator.

8. A multiplexer comprising:
a plurality of filters that include, as at least one among the plurality of filters, the filter device according to claim 1; wherein
input terminals or output terminals of the plurality of filters are directly or indirectly electrically connected to a common terminal.

9. The multiplexer according to claim 8, wherein the plurality of filters includes two filters.

10. The multiplexer according to claim 8, wherein the plurality of filters includes three filters.

11. The multiplexer according to claim 8, wherein the plurality of filters includes four filters.

12. The multiplexer according to claim 8, wherein:
the plurality of filters include an other filter different from the filter device;
the other filter is electrically connected to the first terminal;
a pass band of the other filter include different frequencies from the pass band of the bandpass filter; and
the resonant frequency of the LC resonant circuit is located in the pass band of the other filter.

13. The multiplexer according to claim 12, wherein the resonant frequency of the LC resonant circuit is located on a lower frequency side than a center frequency of the pass band of the other filter.

14. The multiplexer according to claim 12, wherein:
the pass band of the filter device is about 2300 MHz to about 2690 MHz; and
the pass band of the other filter is about 1710 MHz to about 2200 MHz.

15. The multiplexer according to claim 8, wherein the plurality of filters includes a low-band filter.

16. The multiplexer according to claim 15, wherein a pass band of the low-band filter is about 699 MHz to about 960 MHz.

17. The multiplexer according to claim 15, wherein the low-band filter is an LC filter.

18. The multiplexer according to claim 8, wherein the multiplexer transmits and receives signals in a plurality of frequency bands corresponding to the plurality of filters at a same or substantially a same time.

19. A high frequency front-end circuit comprising:
the multiplexer according to claim 8; and
a switch electrically connected to the multiplexer.

20. A high frequency front-end circuit comprising:
the multiplexer according to claim 8; and
an amplifier circuit electrically connected to the multiplexer.

21. A communication device comprising:
an RF signal processing circuit that processes high frequency signals transmitted from and received by an antenna element; and
the high frequency front-end circuit according to claim 19, which transfers the high frequency signals between the antenna element and the RF signal processing circuit.

* * * * *